US010269724B2

(12) United States Patent
Suzuki

(10) Patent No.: US 10,269,724 B2
(45) Date of Patent: Apr. 23, 2019

(54) SEMICONDUCTOR PACKAGE DEVICE INCLUDING ELECTROMAGNETIC WAVE SHIELD AND METHOD OF MANUFACTURING THE SAME

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/431,171

(22) Filed: Feb. 13, 2017

(65) Prior Publication Data

US 2017/0236786 A1    Aug. 17, 2017

(30) Foreign Application Priority Data

Feb. 17, 2016   (JP) ................. 2016-028287

(51) Int. Cl.
*H01L 23/552*   (2006.01)
*H01L 23/49*    (2006.01)
(Continued)

(52) U.S. Cl.
CPC ........ *H01L 23/552* (2013.01); *H01L 21/4867* (2013.01); *H01L 21/561* (2013.01);
(Continued)

(58) Field of Classification Search
CPC . H01L 23/552; H01L 21/485; H01L 21/4853; H01L 21/4857; H01L 21/565; H01L 21/78; H01L 23/3114; H01L 23/49811; H01L 23/49822; H01L 23/49838; H01L 24/16; H01L 2224/16227; H01L 2924/3025; H01L 21/4867;
(Continued)

(56) References Cited

U.S. PATENT DOCUMENTS

2015/0171019 A1*  6/2015  Shibuya ................ H01L 23/552
                                                                     257/659
2015/0235966 A1*  8/2015  Ohhashi ................ H01L 23/552
                                                                     257/659
(Continued)

FOREIGN PATENT DOCUMENTS

JP   2001-044680   2/2001
JP   2004-072051   3/2004

*Primary Examiner* — Didarul Mazumder
(74) *Attorney, Agent, or Firm* — Greer Burns & Crain, Ltd.

(57) ABSTRACT

A method of manufacturing a semiconductor package that includes a package substrate preparing step of preparing a package substrate where semiconductor devices are placed in respective areas demarcated by a plurality of grid-like projected dicing lines and sealed by a layer of sealing resin; a protective film covering step of coating external connection electrodes with a liquid resin thereby to form a protective film thereon; a dividing step of cutting the package substrate along the projected dicing lines with a cutting blade; an electromagnetic wave shield film forming step of applying a metal film to an upper surface of the sealing resin on each of the semiconductor packages and side surfaces of each of the semiconductor packages, thereby forming an electromagnetic wave shield film for blocking electromagnetic waves; and a protective film removing step of removing the protective film.

9 Claims, 7 Drawing Sheets

(51) Int. Cl.
    *H01L 23/14*     (2006.01)
    *H01L 23/31*     (2006.01)
    *H01L 21/48*     (2006.01)
    *H01L 21/56*     (2006.01)
    *H01L 21/68*     (2006.01)
    *H01L 21/78*     (2006.01)
    *H01L 21/683*     (2006.01)
    *H01L 23/00*     (2006.01)
    *H01L 23/498*     (2006.01)

(52) U.S. Cl.
    CPC .......... *H01L 21/6836* (2013.01); *H01L 21/78* (2013.01); *H01L 23/49811* (2013.01); *H01L 24/97* (2013.01); *H01L 21/485* (2013.01); *H01L 21/4857* (2013.01); *H01L 23/145* (2013.01); *H01L 23/147* (2013.01); *H01L 23/3128* (2013.01); *H01L 23/49822* (2013.01); *H01L 23/49827* (2013.01); *H01L 24/16* (2013.01); *H01L 2221/68331* (2013.01); *H01L 2224/16227* (2013.01); *H01L 2224/97* (2013.01); *H01L 2924/15311* (2013.01); *H01L 2924/3025* (2013.01)

(58) Field of Classification Search
    CPC ... H01L 21/561; H01L 21/6836; H01L 24/97; H01L 23/145; H01L 23/147; H01L 23/3128; H01L 23/49827; H01L 2221/68331; H01L 2924/15311
    USPC ......................................................... 257/659
    See application file for complete search history.

(56) References Cited

U.S. PATENT DOCUMENTS

| | | | |
|---|---|---|---|
| 2016/0035680 A1* | 2/2016 | Wu | ........................ H01L 23/552 257/659 |
| 2016/0233111 A1* | 8/2016 | Shiota | .................. H01L 23/3114 |
| 2016/0276307 A1* | 9/2016 | Lin | ....................... H01L 21/561 |
| 2017/0005042 A1* | 1/2017 | Chen | ...................... H01L 23/552 |

* cited by examiner

SEMICONDUCTOR PACKAGE DEVICE INCLUDING ELECTROMAGNETIC WAVE SHIELD AND METHOD OF MANUFACTURING THE SAME

BACKGROUND OF THE INVENTION

Field of the Invention

The present invention relates to a semiconductor package and a method of manufacturing a semiconductor package.

Description of the Related Art

In recent years, portable wireless communication devices such as mobile phones, smart phones, etc. have been incorporating an increased number of electronic parts including a surface acoustic wave (SAW) device, an antenna element, etc. that make up a wireless system installed therein in order to give themselves high functionality and high performance. Various semiconductor packages such as dynamic random access memories (DRAMs), flash memories, etc. for use in such portable wireless communication devices have data transfer rates that have become so high that electromagnetic waves generated by the semiconductor packages are liable to act as noise that has an adverse effect on the wireless system in the portable wireless communication devices. One solution to this problem is to use a sheet metal shield comprising a metal sheet surrounding a circuit that includes a semiconductor package which generates electromagnetic noise (see, for example, Japanese Patent Laid-Open Nos. 2001-44680 and 2004-72051).

SUMMARY OF THE INVENTION

However, the sheet metal shield disclosed in Japanese Patent Laid-Open Nos. 2001-44680 and 2004-72051 needs a large area where it is to be installed, and hence presents an obstacle to efforts to reduce the size and thickness of portable wireless communication devices such as mobile phones, smart phones, etc.

Therefore, it is an object of the present invention to provide a semiconductor package which is capable of blocking electromagnetic noise that tends to have an adverse effect on a wireless system, without employing a sheet metal shield, and a method of manufacturing such a semiconductor package.

In accordance with an aspect of the present invention, there is provided a semiconductor package including a substrate having a first surface, a second surface opposite the first surface, and interconnect patterns disposed therein, a semiconductor device mounted on the first surface of the substrate, a layer of sealing resin sealing the semiconductor device, a plurality of external connection electrodes formed on the second surface of the substrate, an electromagnetic wave shield film for blocking electromagnetic waves, the electromagnetic wave shield film being formed on an upper surface of the layer of sealing resin and side surfaces of the layer of sealing resin and the substrate, and a ground interconnect formed on the substrate and electrically connected to the electromagnetic wave shield film.

In accordance with another aspect of the present invention, there is provided a method of manufacturing a semiconductor package. The method includes a package substrate preparing step of preparing a package substrate where semiconductor devices are placed in respective areas demarcated by a plurality of grid-like projected dicing lines and sealed by a layer of sealing resin, and a plurality of external connection electrodes are formed on the second surface opposite to the first surface sealed by the layer of sealing resin, a protective film covering step of coating the second surface with the external connection electrodes formed thereon, in its entirety with a liquid resin thereby to form a protective film thereon, a dividing step of cutting the package substrate along the projected dicing lines with a cutting blade, so that the package substrate is divided into individual semiconductor packages, an electromagnetic wave shield forming step of applying a metal film to an upper surface of the layer of sealing resin on each of the semiconductor packages and side surfaces of each of the semiconductor packages, thereby forming an electromagnetic wave shield film for blocking electromagnetic waves, and a protective film removing step of removing the protective film formed on the second surface, with the external connection electrodes formed thereon, of each of the semiconductor packages.

According to the present invention, the electromagnetic wave shield film is formed on the upper surface of the layer of sealing resin on each of the semiconductor packages and the side surfaces of each of the semiconductor packages. Each of the semiconductor packages is of such a structure that when it is mounted on a mother substrate, the electromagnetic wave shield film is grounded, i.e., connected to a ground pattern on the mother substrate. Therefore, each semiconductor package does not have an adverse effect on a wireless system in a wireless communication device which incorporates the semiconductor package therein, even though no sheet metal shield is employed in the semiconductor package.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
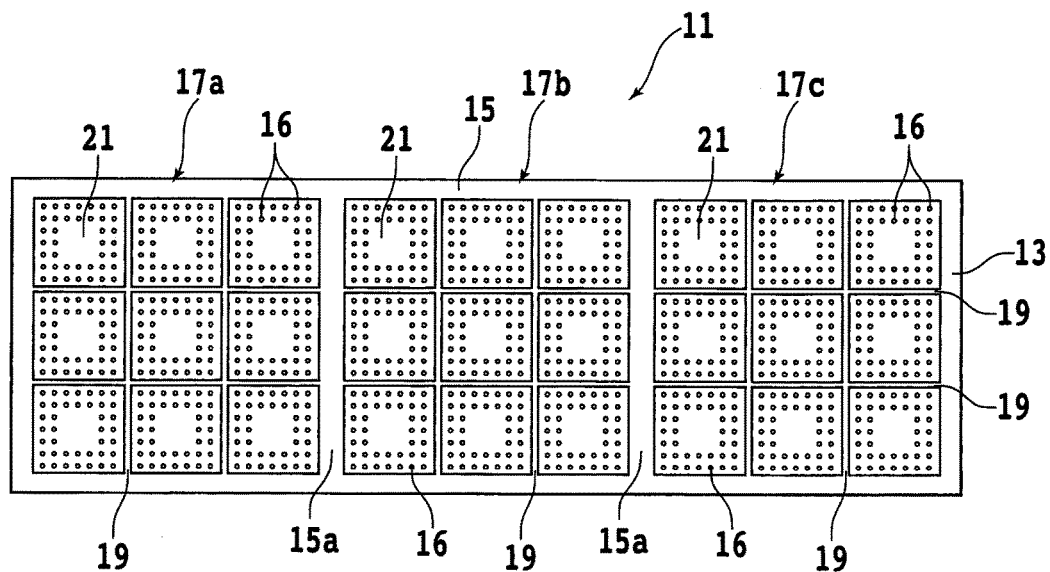
FIG. 1A is a plan view of a package substrate.
Figure 1B:
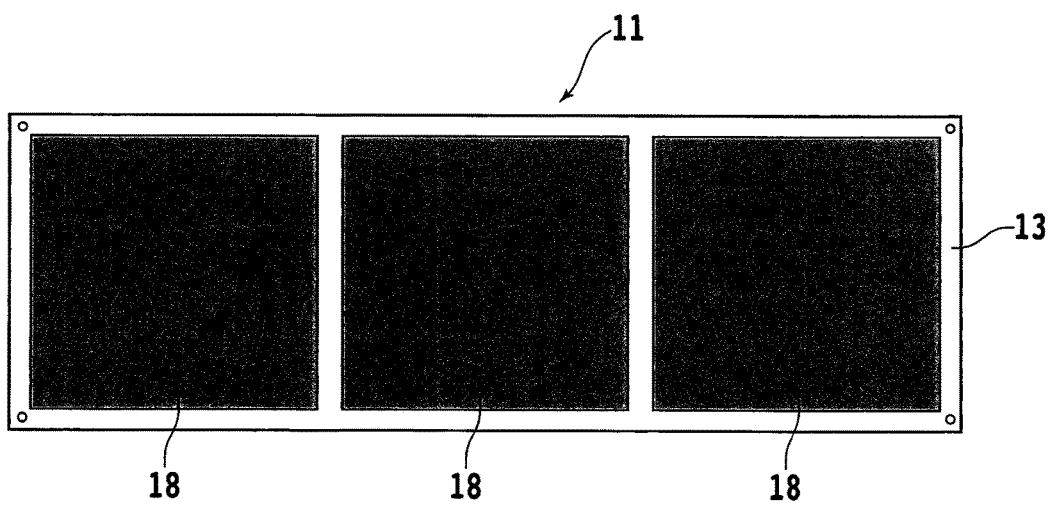
FIG. 1B is a rear view of the package substrate.

Preferred embodiments of the present invention will be described in detail below with reference to the drawings. FIG. 1A depicts in plan a package substrate 11 including semiconductor packages in the form of ball grid array (BGA) packages according to a first embodiment of the present invention. FIG. 1B depicts the reverse side of the package substrate 11. The package substrate 11 has a rectangular resin substrate 13 including an outer peripheral extra region 15 and non-device regions 15a which jointly surround a plurality of (three in the illustrated embodiment) device regions 17a, 17b and 17c. According to the present embodiment, the substrate 13 is made of resin. However, the resin substrate 13 may be replaced with a silicon substrate.

Figure 2:
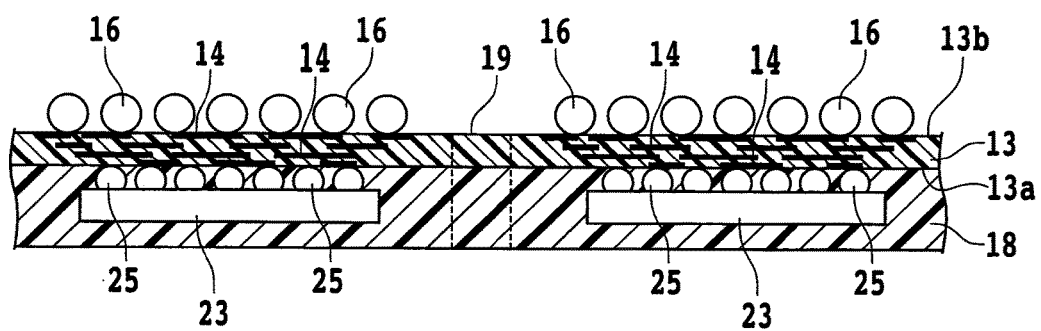
FIG. 2 is an enlarged fragmentary cross-sectional view of the package substrate.

Each of the device regions 17a, 17b and 17c is demarcated into a matrix of device placement areas 21 by a plurality of projected dicing lines 19 which extend perpendicularly to each other. As depicted in FIG. 2, a semiconductor device 23 having a plurality of bumps 25 is disposed in each of the device placement areas 21. As depicted in FIGS. 1B and 2, the substrate 13 has a first surface 13a on its reverse side, which corresponds to the respective device regions 17a, 17b and 17c, where the semiconductor devices 23 are disposed and sealed by a layer 18 of sealing resin, i.e., molded resin, and a second surface 13b on its face side opposite the first surface 13a. Interconnect patterns or conductor patterns 14 are formed on the first surface 13a and the second surface 13b, and also formed in the substrate 13.

As best depicted in FIG. 2, a plurality of external connection electrodes (bumps) 16 connected to the interconnect patterns 14 in the substrate 13 are disposed on the second surface 13b of the substrate 13. As best depicted in FIG. 1A, the external connection electrodes 16 are arranged along the four sides of each of the semiconductor devices 23.

A method of manufacturing a semiconductor package according to the present embodiment will be described below. According to the manufacturing method, a package substrate preparing step is first carried out to prepare the package substrate 11 where, as depicted in FIGS. 1A and 1B, the semiconductor devices 23 are placed on the first surface 13a in the device placement areas 21 demarcated by the grid-like projected dicing lines 19 and sealed by the layer 18 of sealing resin, and the external connection electrodes (bumps) 16 are formed on the second surface 13b opposite to the sealed first surface 13a.

Figure 3:
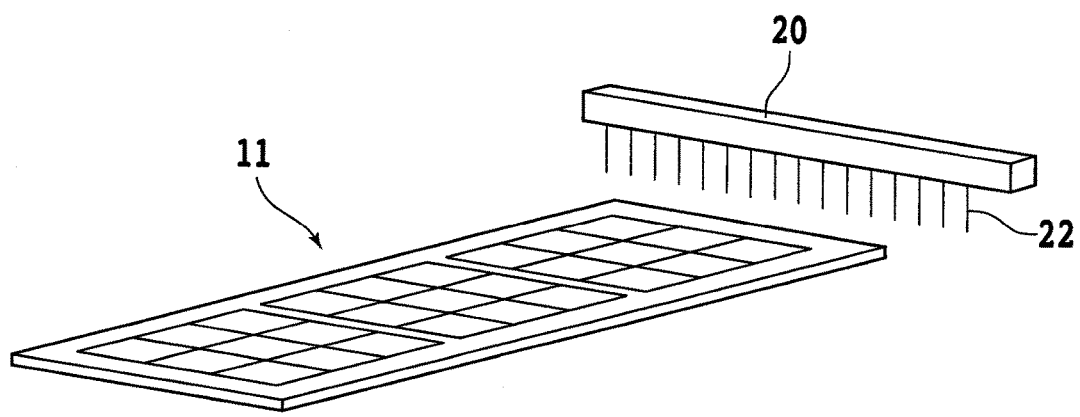
FIG. 3 is a perspective view depicting a protective film covering step by way of example.
Figure 4A:
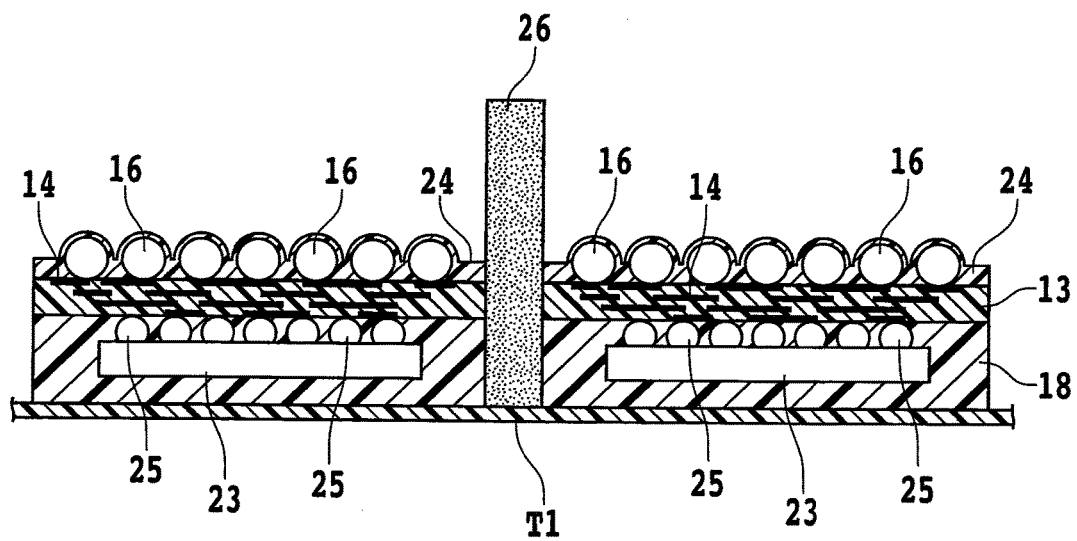
FIG. 4A is an enlarged fragmentary cross-sectional view of the package substrate, depicting a dividing step.

Then, a protective film covering step is carried out. In the protective film covering step, as depicted in FIG. 3, the entire second surface 13b with the external connection electrodes 16 of the package substrate 11 is coated with a liquid resin 22 from a liquid resin coater 20. The liquid resin 22 applied to the second surface 13b is cured into a protective film 24 thereon, as depicted in FIG. 4A. The protective film covering step may be carried out according to a known screen printing process, spray coating process, laminating process, spin coating process, ink jet process, evaporation process, or the like.

The protective film covering step is followed by a package substrate supporting step. In the package substrate supporting process, the layer 18 of sealing resin of the package substrate 11 is applied to a dicing tape T1, as depicted in FIG. 4A, and the outer periphery of the dicing tape T1 is applied to an annular frame, not depicted, so that the package substrate 11 is supported by the annular frame through the dicing tape T1.

Then, a dividing step is carried out. In the dividing step, the package substrate 11 is held under suction through the dicing tape T1 on a chuck table of a cutting apparatus. Thereafter, as depicted in FIG. 4A, the package substrate 11 is cut along all the projected dicing lines 19 that extend longitudinally and transversely across the package substrate 11 by a cutting blade 26 of the cutting apparatus, so that the package substrate 11 is divided into individual semiconductor packages 27 (see FIG. 4B). In the dividing step, the cutting blade 26 as it moves along the projected dicing lines 19 cut into the dicing tape T1, thereby fully severing the package substrate 11.

Figure 4B:
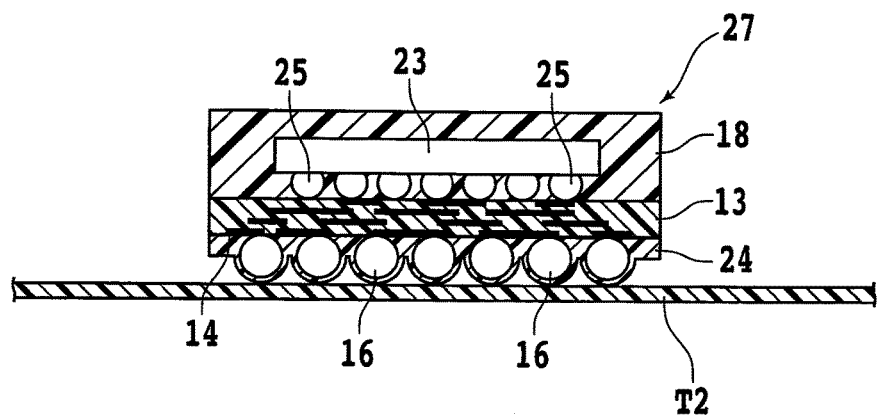
FIG. 4B is an enlarged cross-sectional view of a semiconductor package which has been divided by the dividing step.

After the dividing step, a semiconductor package supporting step is carried out. In the semiconductor package supporting step, as depicted in FIG. 4B, the semiconductor packages 27 are turned upside down, and the protective films 24 thereof are applied to a dicing tape T2. The outer periphery of the dicing tape T2 is applied to a frame, not depicted, so that the semiconductor packages 27 are supported by the frame through the dicing tape T2.

Figure 5A:
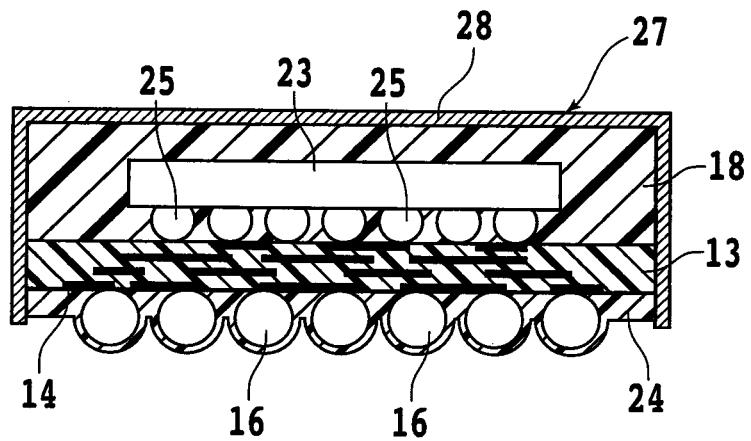
FIG. 5A is an enlarged cross-sectional view of the semiconductor package after an electromagnetic wave shield film forming step has been carried out.

After the semiconductor package supporting step, an electromagnetic wave shield film forming step is carried out. In the electromagnetic wave shield film forming step, the semiconductor packages 27 supported by the frame through the dicing tape T2 are loaded into an evaporation furnace. In the evaporation furnace, a metal film is applied to upper and side surfaces of the semiconductor packages 27 by chemical vapor deposition (CVD) or physical vapor deposition (PVD), thereby forming an electromagnetic wave shield film 28 for blocking electromagnetic waves on each of the semiconductor packages 27, as depicted in FIG. 5A.

The electromagnetic wave shield film 28 is formed on the upper surface of the layer 18 of sealing resin and the side surfaces of the layer 18 of sealing resin and the substrate 13. The thickness of the electromagnetic wave shield film 28 should preferably be in the range from 2 to 10 μm, for example, and more preferably be in the range from 3 to 8 μm. The metal of the electromagnetic wave shield film 28 may be copper, aluminum, nickel, stainless steel, or the like, for example.

Figure 5B:
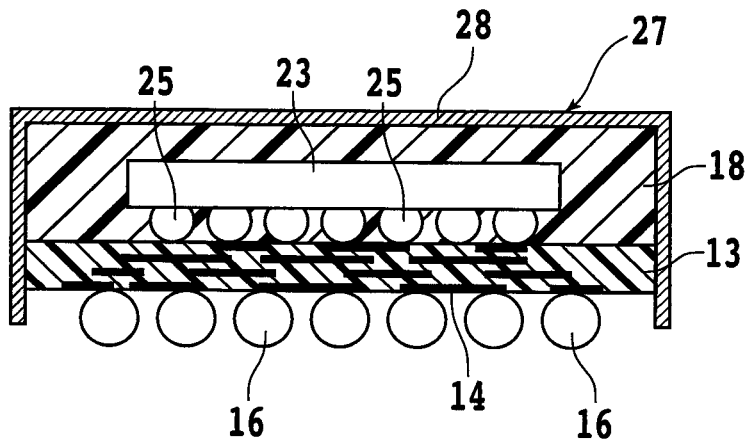
FIG. 5B is an enlarged cross-sectional view of the semiconductor package after a protective film removing step has been carried out.

The electromagnetic wave shield film forming step is followed by a protective film removing step. In the protective film removing step, the protective film 24 on the second surface 13b with the external connection electrodes 16 of the semiconductor package 27 is removed. FIG. 5B depicts in cross section the semiconductor package 27 after the protective film removing step has been carried out.

Figure 7A:
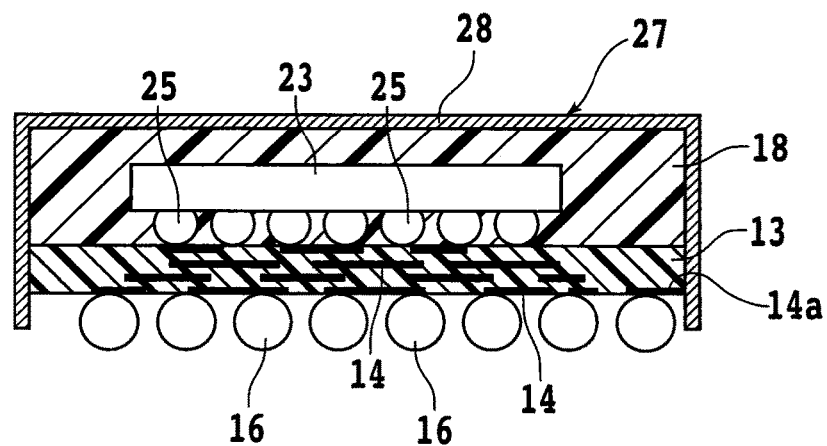
FIGS. 7A and 7B are enlarged cross-sectional views of respective semiconductor packages, depicting different grounding structures.

At this time, as depicted in FIG. 7A, the electromagnetic wave shield film 28 is electrically connected to a ground interconnect 14a (not depicted in FIG. 5B) formed on the second surface 13b of the substrate 13 and extending to a side surface of the substrate 13. Therefore, when the semiconductor package 27 is flip-chip mounted on a mother substrate, not depicted, through the external connection electrodes 16, the electromagnetic wave shield film 28 is electrically connected to a ground pattern on the mother substrate through the ground interconnect 14a and the external connection electrodes 16, so that the electromagnetic wave shield film 28 is grounded.

Figure 6A:
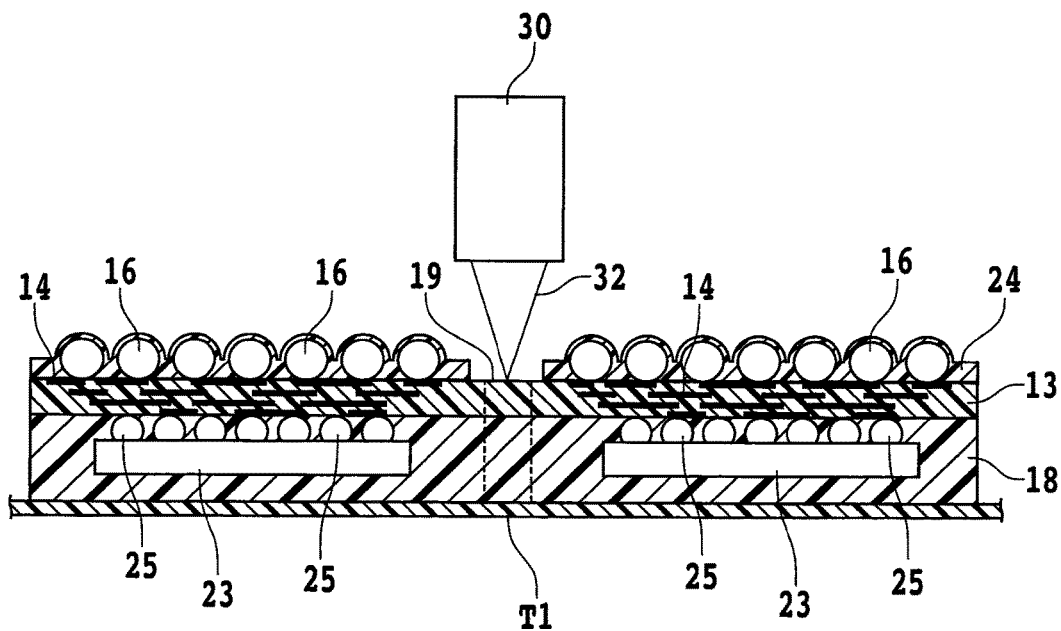
FIG. 6A is an enlarged fragmentary cross-sectional view of a package substrate, depicting a partial protective film removing step.

A dividing step and an electromagnetic wave shield film forming step according to a second embodiment of the present invention will be described below with reference to FIGS. 6A through 7B. In the dividing step according to the second embodiment, as depicted in FIG. 6A, a partial protective film removing step is carried out to irradiate the package substrate 11 with a laser beam 32 emitted from a processing head or beam condenser 30 of a laser processing machine for removing the protective film 24 on the projected dicing lines 19.

The laser beam 32 should preferably have a wavelength absorbable by the protective film 24, and may be a third harmonic having a wavelength of 355 nm of YAG laser, for example. In the partial protective film removing step, since it is necessary to remove a width, greater than the width of the cutting blade 26, of the protective film 24 along each of the projected dicing lines 19, the laser beam 32 is moved a predetermined distance transversely across the projected dicing line 19 repeatedly back and forth to scan a plurality of paths over the width to be removed, while being moved along the projected dicing line 19. In this manner, strips, wider than the thickness of the cutting blade 26, of the protective film 24 are removed along all of the projected dicing lines 19.

Figure 6B:
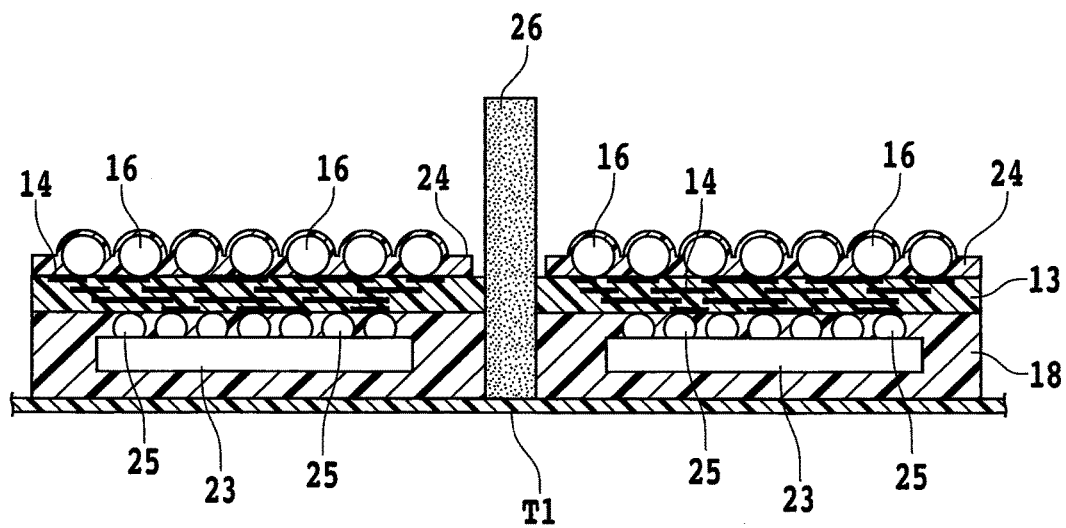
FIG. 6B is an enlarged fragmentary cross-sectional view of the package substrate, depicting a dividing step after the partial protective film removing step has been carried out.

After the partial protective film removing step, the dividing step is carried out to cut the package substrate 11 along the projected dicing lines 19 with the cutting blade 26, dividing the package substrate 11 into individual semiconductor packages 27, as depicted in FIG. 6B.

Figure 7B:
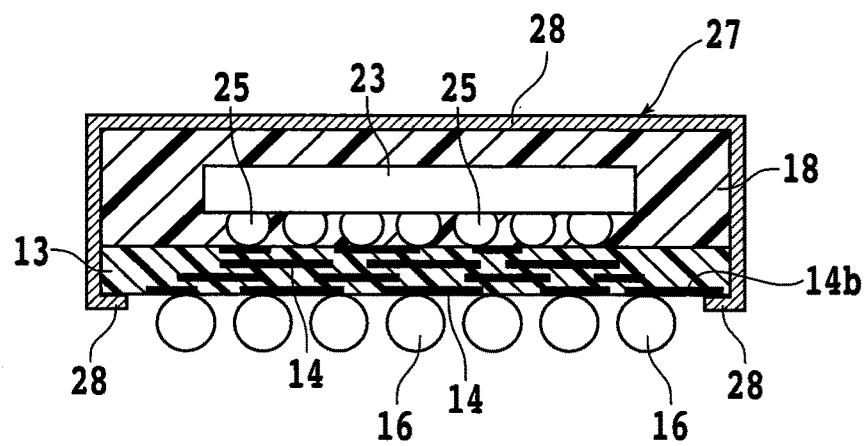

The dividing step is followed by the electromagnetic wave shield film forming step. In the electromagnetic wave shield film forming step, the semiconductor packages 27 are turned upside down, and the protective films 24 of the package substrate 11 are applied to a dicing tape T2, in the same manner as described above with reference to FIG. 4B. As depicted in FIG. 7B, a metal film is applied to resin-sealed upper surfaces of the semiconductor packages 27 and side surfaces of the layers 18 of sealing resin and the substrates 13 by CVD or PVD, thereby forming an electromagnetic wave shield film 28 on each of the semiconductor packages 27.

According to the second embodiment, inasmuch as the predetermined widths of the protective film 24 have been removed along the projected dicing lines 19 in the partial protective film removing step depicted in FIG. 6A, the electromagnetic wave shield film 28 is also formed partly on the second surface 13b of the substrate 13, as depicted in FIG. 7B. Consequently, the electromagnetic wave shield film 28 will be electrically connected to a ground pattern on a mother substrate through a ground interconnect 14b and the external connection electrodes 16. The second embodiment is effectively applicable to a semiconductor package 27 where the ground interconnect 14b does not extend to, but terminates short of, a side surface of the substrate 13.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a semiconductor package including a substrate having a first surface, a second surface opposite said first surface, and interconnect patterns disposed therein, a semiconductor device mounted on said first surface of the substrate, a layer of sealing resin sealing said semiconductor device, a plurality of external connection electrodes formed on said second surface of the substrate, an electromagnetic wave shield film for blocking electromagnetic waves, said electromagnetic wave shield film being formed on an upper surface of said layer of sealing resin and side surfaces of said layer of sealing resin and said substrate, and a ground interconnect formed on said substrate and electrically connected to said electromagnetic wave shield film, said method comprising:

a package substrate preparing step of preparing a package substrate where semiconductor devices are placed in respective areas demarcated by a plurality of grid-like projected dicing lines and sealed by a layer of sealing resin, and a plurality of external connection electrodes are formed on the second surface opposite to the first surface sealed by said layer of sealing resin;

a protective film covering step of coating the second surface with the external connection electrodes formed thereon, in its entirety with a liquid resin thereby to form a protective film thereon;

a dividing step of cutting said package substrate along the projected dicing lines with a cutting blade, so that the package substrate is divided into individual semiconductor packages, wherein the dividing step is performed after performing the protective film covering step;

an electromagnetic wave shield film forming step of applying a metal film to an upper surface of the layer of sealing resin on each of the semiconductor packages and side surfaces of each of the semiconductor packages, thereby forming an electromagnetic wave shield film for blocking electromagnetic waves, wherein the electromagnetic wave shield film forming step is performed after performing the protective film covering step; and a protective film removing step of removing the protective film formed on the second surface, with the external connection electrodes formed thereon, of each of the semiconductor packages.

2. The method according to claim 1, further comprising:
a partial protective film removing step of, after performing the protective film covering step and before performing the dividing step, partly removing the protective film on the projected dicing lines of the package substrate along the projected dicing lines.

3. The method according to claim 2, wherein said partial protective film removing step results in the removal of strips of the protective film, wherein said strips are wider than a thickness of the cutting blade used during said dividing step.

4. The method according claim 2, wherein said partial protective film removing step results in the removal of strips of the protective film, wherein said strips extend from an outer surface of the protective film to the second surface of the substrate.

5. The method according claim 2, wherein said partial protective film removing step results in the removal of strips of the protective film, wherein said strips do not extend into the substrate.

6. The method according to claim 1, wherein said electromagnetic wave shield film forming step is performed while the protective film is in direct contact with a dicing tape.

7. The method according to claim 1, wherein the ground interconnect comprises a pair of ground interconnects that terminate short of the side surfaces of the semiconductor package, and further wherein the electromagnetic wave shield film also includes portions formed on the second surface of the substrate that are configured and arranged to be electrically connected to the pair of ground interconnects that terminate short of the side surfaces of the semiconductor package.

8. The method according to claim 1, further comprising:
a semiconductor packages supporting step of pasting a protective film side of the semiconductor packages to a dicing film, the outer periphery of the dicing film being applied to a frame to thereby support a plurality of semiconductor packages by the frame through the dicing tape, after performing said dividing step, wherein said electromagnetic wave shield film forming step is performed after performing said semiconductor packages supporting step.

9. The method according to claim 3, wherein the electromagnetic wave shield film is formed not only on the upper surface of said layer of sealing resin and side surfaces of said layer of sealing resin and said substrate but is also formed on partly on the second surface of said substrate in said electromagnetic wave shield film forming step.

* * * * *